(12) United States Patent
Shi

(10) Patent No.: US 8,314,552 B2
(45) Date of Patent: Nov. 20, 2012

(54) PHOSPHOR LAYER ARRANGEMENT FOR USE WITH LIGHT EMITTING DIODES

(75) Inventor: Wei Shi, San Jose, CA (US)

(73) Assignee: Bridgelux, Inc., Livermore, CA (US)

( * ) Notice: Subject to any disclaimer, the term of this patent is extended or adjusted under 35 U.S.C. 154(b) by 0 days.

(21) Appl. No.: 12/978,913

(22) Filed: Dec. 27, 2010

(65) Prior Publication Data

US 2011/0092003 A1  Apr. 21, 2011

Related U.S. Application Data

(62) Division of application No. 12/819,544, filed on Jun. 21, 2010, now Pat. No. 8,098,011, which is a division of application No. 12/208,142, filed on Sep. 10, 2008, now Pat. No. 7,859,190.

(51) Int. Cl.
*H05B 33/04* (2006.01)
(52) U.S. Cl. ............. 313/512; 257/98; 257/99; 257/100
(58) Field of Classification Search .................. 313/512; 257/98–100
See application file for complete search history.

(56) References Cited

U.S. PATENT DOCUMENTS

| | | | | |
|---|---|---|---|---|
| 6,747,406 | B1* | 6/2004 | Bortscheller et al. | 313/512 |
| 7,029,935 | B2* | 4/2006 | Negley et al. | 438/29 |
| 2005/0006659 | A1* | 1/2005 | Ng et al. | 257/99 |
| 2007/0075325 | A1* | 4/2007 | Baek et al. | 257/99 |
| 2007/0090383 | A1* | 4/2007 | Ota et al. | 257/98 |
| 2008/0054280 | A1* | 3/2008 | Reginelli et al. | 257/98 |

* cited by examiner

*Primary Examiner* — Mary Ellen Bowman

(57) ABSTRACT

Phosphor layer arrangement for use with light emitting diodes. In an aspect, a light emitting diode apparatus is provided that includes a least one light emitting diode, an encapsulation covering the at least one light emitting diode, a lens having a phosphor layer formed upon a bottom surface, the lens positioned to cover at least part of the encapsulation, and an air gap between the phosphor layer and the encapsulation. In an aspect, a light emitting diode lamp is provided that includes a package, a least one light emitting diode, an encapsulation covering the at least one light emitting diode, a lens having a phosphor layer formed upon a bottom surface, wherein the lens is positioned to cover at least part of the encapsulation, and an air gap between the phosphor layer and the encapsulation.

5 Claims, 6 Drawing Sheets

PHOSPHOR LAYER ARRANGEMENT FOR USE WITH LIGHT EMITTING DIODES

RELATED APPLICATION

This patent application is a divisional of patent application Ser. No. 12/819,544 filed on Jun. 21, 2010 which is a divisional of patent application Ser. No. 12/208,142 filed on Sep. 10, 2008. The entire content of both of which are hereby incorporated explicitly by reference.

FIELD OF THE INVENTION

The present application relates generally to light emitting diodes, and more particularly, to a phosphor layer arrangement for use with light emitting diodes to provide enhanced light output.

BACKGROUND OF THE INVENTION

Light emitting diodes (LEDs) for use as indicators are well known. LEDs have been used extensively for this purpose in consumer electronics. For example, red LEDs are commonly used to indicate that power has been applied to devices such as radios, televisions, video recorder (VCRs) and the like.

Recently, high-power LEDs have seen increased use in general lighting applications. For example, high-power LEDs can now be found in overhead lighting, street lighting, and in automotive application, such as in automobile headlamps. Typically, high-power LEDs are provided as an assembly comprising one or more LEDs mounted to a substrate and protected by an encapsulation. Light emitted from the LEDs passes through and is focused by the encapsulation before it is visible to a user.

It is desirable to have high-power LED assemblies that produce light of different colors. For example, white light can be produced by using phosphor to convert blue light emitted from an LED. In conventional LED assemblies, an organic phosphor dye is use to coat the LED chip. Unfortunately, this arrangement has poor conversion efficiency and low light output because of "backscatter." Backscatter occurs because the phosphor layer is in direct contact with the LED chip causing light to reflect back toward the LED chip thereby decreasing light output.

Therefore, what is needed is a way to avoid the problems associated with backscatter to increase the optical output of high power LEDs

SUMMARY OF THE INVENTION

In one or more aspects, a phosphor layer arrangement is provided for use with one or more light emitting diodes to overcome the problems associated with backscatter to provide increased optical output.

In an aspect, a light emitting diode apparatus is provided that comprises a least one light emitting diode, an encapsulation covering the at least one light emitting diode, a lens having a phosphor layer formed upon a bottom surface, the lens positioned to cover at least part of the encapsulation, and an air gap between the phosphor layer and the encapsulation.

In an aspect, a method is provided for forming a light emitting diode apparatus. The method comprises encapsulating at least one light emitting diode with an encapsulation, covering the encapsulation with a lens having a phosphor layer formed upon a bottom surface, wherein an air gap is formed between the encapsulation and the phosphor layer.

In an aspect, a light emitting diode lamp is provided that comprises a package, a least one light emitting diode, an encapsulation covering the at least one light emitting diode, a lens having a phosphor layer formed upon a bottom surface, wherein the lens is positioned to cover at least part of the encapsulation, and an air gap between the phosphor layer and the encapsulation.

In an aspect, an illumination device is provided that comprises a power source and a light emitting diode lamp in electrical communication with the power source. The light emitting diode lamp comprises a package, a least one light emitting diode, an encapsulation covering the at least one light emitting diode, a lens having a phosphor layer formed upon a bottom surface, wherein the lens is positioned to cover at least part of the encapsulation, and an air gap between the phosphor layer and the encapsulation.

In an aspect, a light emitting diode apparatus is provide that comprises a least one light emitting diode, an encapsulation covering the at least one light emitting diode, and a lens having a phosphor layer formed between first and second lens portions, the lens positioned so that the second lens portion fits against the encapsulation.

Other aspects will become apparent after review of the hereinafter set forth Brief Description of the Drawings, Description, and the Claims.

BRIEF DESCRIPTION OF THE DRAWINGS

The foregoing aspects described herein will become more readily apparent by reference to the following Description when taken in conjunction with the accompanying drawings wherein.

DETAILED DESCRIPTION OF THE EMBODIMENT(S)

In various aspects, a phosphor layer arrangement is provided for use with one or more light emitting diodes so as to provide increased optical output.

Figure 1:
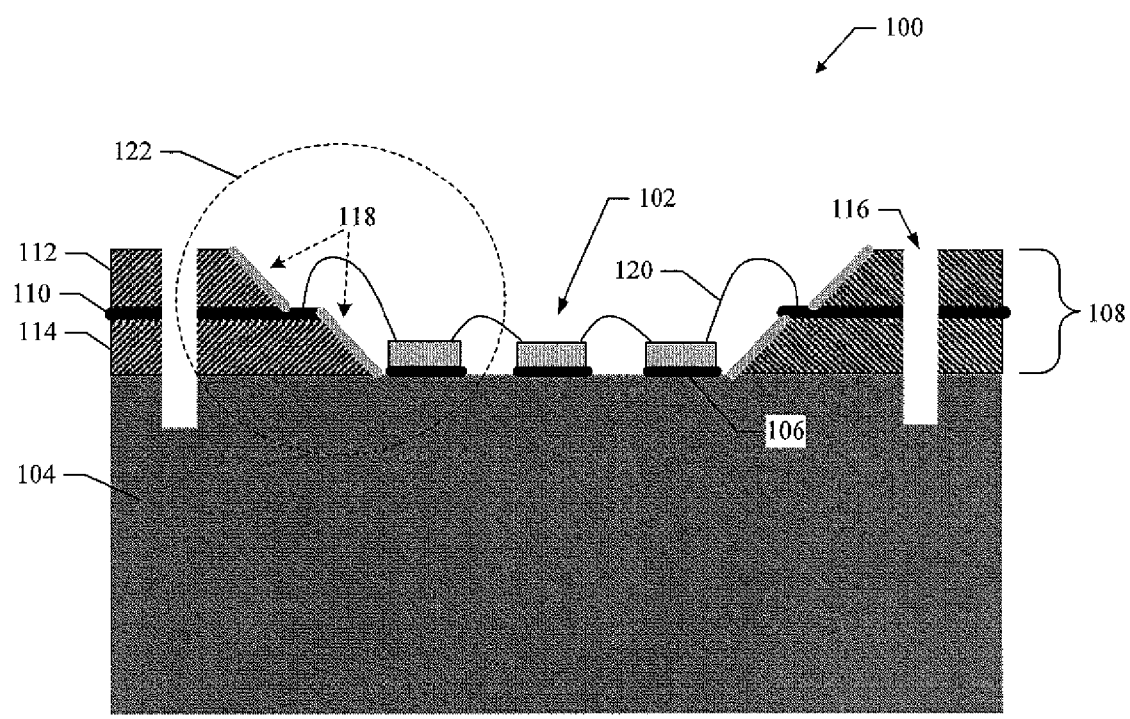
FIG. 1 shows an exemplary substrate for use with aspects of a phosphor layer arrangement.

FIG. 1 shows an exemplary substrate 100 for use with aspects of a phosphor layer arrangement. The substrate 100 comprises three LED dies shown generally at 102 that are mounted to substrate material 104. Although three LED dies are shown, aspects of the phosphor layer arrangement are suitable for use with any number of LED dies. In an aspect, the substrate material 104 comprises at least one of Al, Cu, AlN, and AlSiC. However, the substrate material 104 may comprise of any suitable material. The LED dies 102 are mounted to the substrate material 104 with a thermal interface material 106. A plastic lamination 108 is also mounted to the substrate material 104. The plastic (or FR4) lamination 108 comprises a lead frame 110 sandwiched between upper 112 and lower 114 layers of plastic (or FR4). The lead frame 110 comprises copper or silver and allows power to be routed to the LED dies 102. The plastic (or FR4) lamination 108 and substrate 104 include a slot 116 to allow for mounting of a lens which is described in detail in another section of this document.

Silver plate reflectors 118 are mounted on the plastic (or FR4) lamination 108 to form a stepped reflector which exposes a portion of the lead frame 110 to provide a bonding region to attach to a bonding wire 120. A more detailed description of the stepped reflector region 122 is provided in another section of this document.

Figure 2:
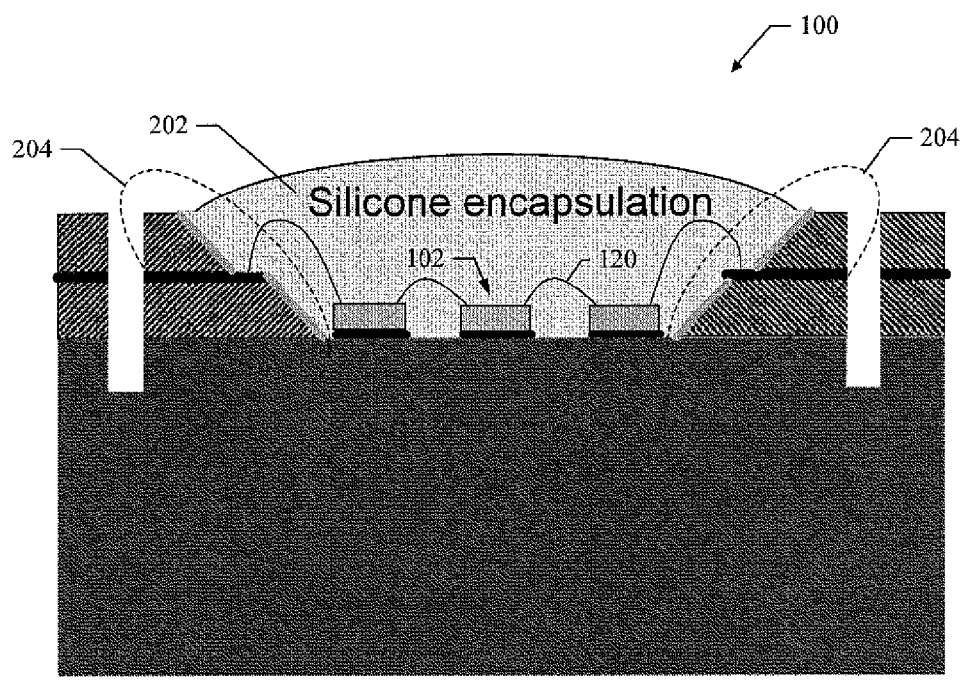
FIG. 2 shows the substrate of FIG. 1 with a silicone encapsulation for use in aspects of a phosphor layer arrangement.

FIG. 2 shows the substrate 100 with a silicone encapsulation 202 for use in aspects of a phosphor layer arrangement. For example, the encapsulation 202 is molded or otherwise formed within the region bounded by the stepped reflector 204. The encapsulation 202 operates to protect the LED dies 102 and bonding wires 120. The encapsulation 202 also operates to extract light emitted from the LED dies 102.

Figure 3:
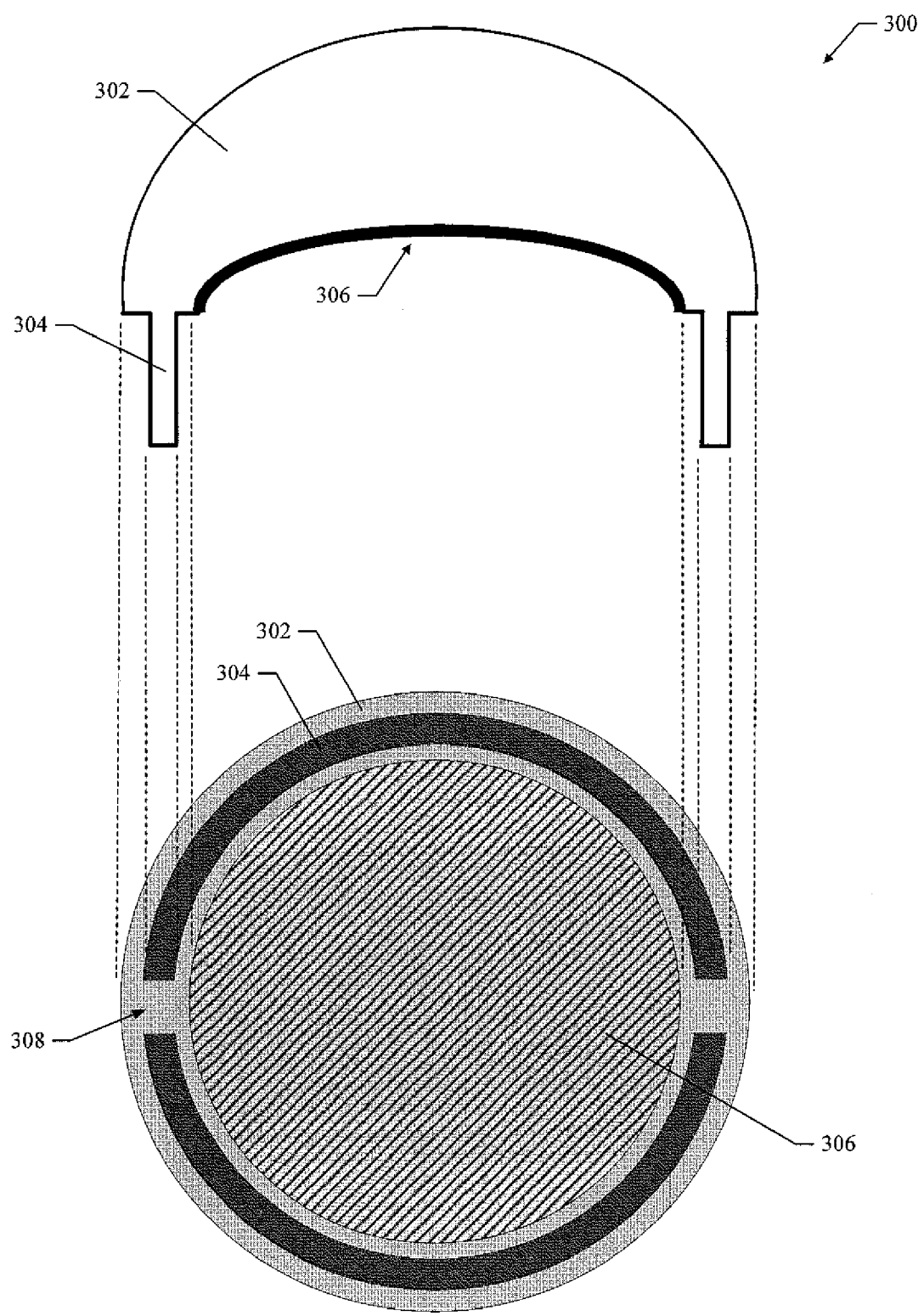
FIG. 3 shows exemplary side and bottom views of a lens for use in aspects of a phosphor layer arrangement.

FIG. 3 shows side and bottom views of an exemplary lens 300 for use in aspects of a phosphor layer arrangement. The lens 300 is configured to focus light emitted by the LED dies 102 and extracted by the encapsulation 202. The lens 300 includes a domed focusing portion 302 that comprises glass or plastic and is configured to fit over the encapsulation 202. The lens 300 also comprises a ridge feature 304 that is configured to fit into the slot 116 shown in FIG. 1. As illustrated at 308, there is a break in the ridge feature to provide a path for the lead frame 110.

A phosphor layer 306 is formed upon a bottom surface of the lens 300. In various aspects, the phosphor layer 306 may be deposited, etched, attached, or otherwise prepared or fabricated upon the bottom surface of the lens 300. For example, the phosphor layer is coated or molded onto the bottom surface of the lens 300 with a thickness that depends on the optical design to produce the maximum light output (i.e., lumens per watt). It should be noted that aspects of the phosphor layer arrangement are not limited to producing only white light because different type of phosphor may be used to produce a different color light.

The phosphor layer 306 is configured to efficiently convert blue light emitted from the LED dies 102 into white light. In an aspect, the phosphor layer 306 comprises an inorganic dye distributed with a uniform thickness over the bottom surface of the lens 300. In another aspect, the phosphor layer 306 is distributed with varying thicknesses over the bottom surface of the lens 300. For example, in an aspect, the phosphor layer 306 is distributed with a thickness in the range of 5 to 500 microns. Thus, the application of the phosphor layer 306 to the bottom surface of the lens can be done with any desired thickness to achieve highly efficient conversion of light.

Figure 4:
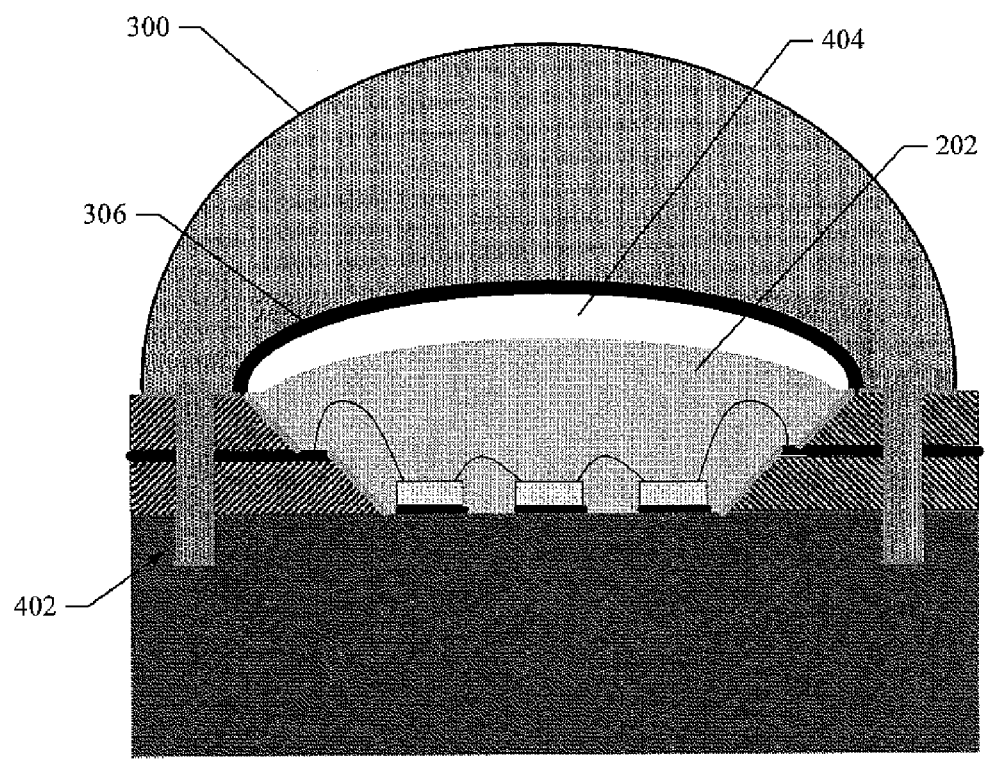
FIG. 4 shows an exemplary LED assembly having aspects of a phosphor layer arrangement.

FIG. 4 shows an exemplary LED assembly 400 having a phosphor layer arrangement. In the assembly 400, the lens 300 is fitted on the substrate material 104 by inserting the ridge feature 304 into the slot 116 as illustrated at 402. When the lens 300 is fitted on the substrate material 104, the phosphor layer 306 is positioned above the encapsulation 202 so that light passing through the encapsulation 202 will strike the phosphor layer 306. In an aspect, an adhesive is used to seal the lens 300 into position.

When the lens 300 is in place, an air gap 404 is formed between the encapsulation 202 and the phosphor layer 306. In an aspect, the air gap is in the range of 5 to 1000 microns thick. The air gap 404 provides a lower refractive index between the encapsulation 202 and the phosphor layer 306 that allows more light to pass through the phosphor layer 306 and reduces the amount of light reflected back into the encapsulation 202 as backscatter. For example, without the phosphor layer arrangement described herein, backscatter may account for 60% of the light emitted from the LED dies. With the phosphor layer arrangement described herein, there may be up to a 20-30% improvement in light total output. Thus, more light is output from the lens 300.

The size of the air gap is determined by the shape of the lens 300, the encapsulation 202, and the phosphor layer 306. By controlling these geometries, an air gap of virtually any size or shape can be formed so as to reduce backscatter and maximize the amount of light output from the lens.

It should also be noted that in various aspects, the geometries and/or shapes described with reference to the phosphor layer 306 and the air gap 404 may have varying dimensions. Thus, in various aspects, a phosphor layer arrangement may be formed have varying dimensions and is not limited to having the exact features or dimensions described herein.

Figure 5:
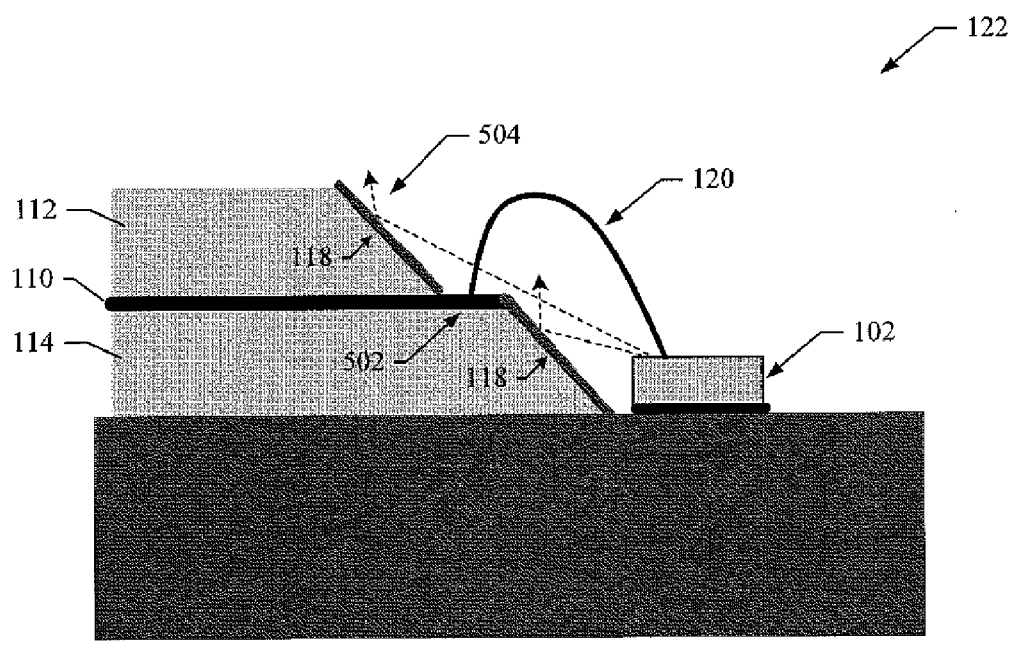
FIG. 5 shows a detailed view of an exemplary stepped reflector for use in aspects of a phosphor layer arrangement.

FIG. 5 shows a detailed view of the stepped reflector region 122 illustrated in FIG. 1. The stepped reflector region 122 is formed by reducing the amount of plastic material of the upper plastic layer 112 so as to expose a bonding area 502 of the lead frame 110. Reflective material 118 is placed on the upper plastic 112 and lower plastic 114 surfaces as illustrated. The reflective material 118 may be Ag or any other suitable material. A bonding wire 120 can be attached to the bonding area 502 to provide power to the LED die 102. As illustrated, both the upper 112 and lower 114 regions of the stepped reflector reflect light emitted from the die 102 as shown at 124.

Thus, aspects of a phosphor layer arrangement comprises a stepped reflector that provides a bonding region while providing a reflective region to reflecting light emitted from the LED die 102.

Figure 6:
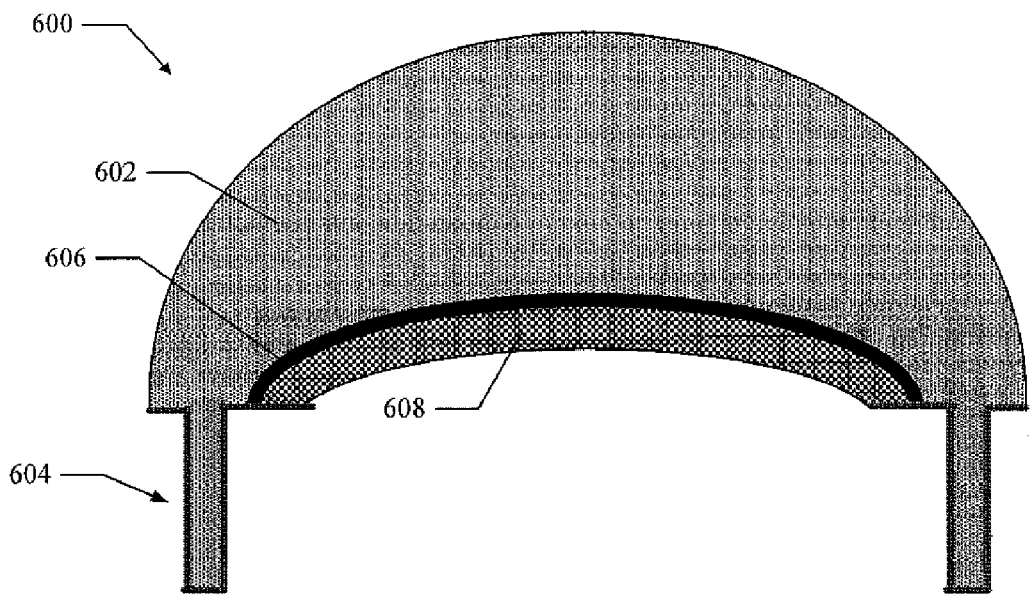
FIG. 6 shows an exemplary lens for use in aspects of a phosphor layer arrangement.

FIG. 6 shows an exemplary lens 600 for use in aspects of a phosphor layer arrangement. The lens 600 is configured to focus light emitted by the LED dies 102 and extracted by the encapsulation 202. The lens 600 includes a first lens portion 602 that comprises glass or plastic and is configured to fit onto the substrate 104. The first lens portion 602 also comprises a ridge feature 604 that is configured to fit into the slot 116 shown in FIG. 1. In an aspect, the ridge feature 604 also includes a break (or recess) to provide a path for the lead frame 110.

A phosphor layer 606 is formed upon a bottom surface of the first lens portion 602. In various aspects, the phosphor layer 606 may be disposed on, deposited, etched, attached, or otherwise prepared or fabricated upon the bottom surface of the first lens portion 602. For example, the phosphor layer is coated or molded onto the bottom surface of the first lens portion 602 with a thickness that depends on the optical design to produce the maximum light output (i.e., lumens per watt). It should be noted that aspects of the phosphor layer arrangement are not limited to producing only white light because different type of phosphor may be used to produce a different color light.

The phosphor layer 606 is configured to efficiently convert blue light emitted from the LED dies 102 into white light. In an aspect, the phosphor layer 606 comprises an inorganic dye distributed with a uniform thickness over the bottom surface of the first lens portion 602. In another aspect, the phosphor layer 606 is distributed with varying thicknesses over the bottom surface of the first lens portion 600. For example, in an aspect, the phosphor layer 606 is distributed with a thickness in the range of 5 to 500 microns. Thus, the application of the phosphor layer 606 to the bottom surface of the lens can be done with any desired thickness to achieve high efficiency conversion of light.

The lens 600 also comprises a second lens portion 608 that comprises glass or plastic having a low refractive index. In an aspect, the second lens portion 608 may be any suitable transparent material with a low index of refraction. Transparent means no significant obstruction or absorption of electromagnetic radiation in the particular wavelength (or wavelengths) of interest.

The second lens portion 608 adheres to the phosphor layer and has a shape and thickness based on the following factors:
[0043]1. Phosphor layer shape and thickness [0044]2 Encapsulation shape [0045]3. Contoured to provide a small air gap or no air gap between the second lens portion 608 and encapsulation.

Thus, because of the low refractive index of the second lens portion 608, less backscatter will occur and more light will be focused to pass through the phosphor layer 606 and be converted to white light. It should also be noted that in another aspect, the phosphor layer 606 is formed upon a top surface of the second lens portion 608. Thus, several techniques are possible to generate a phosphor layer arrangement where the phosphor layer 606 is formed between the first and second lens portions.

Figure 7:
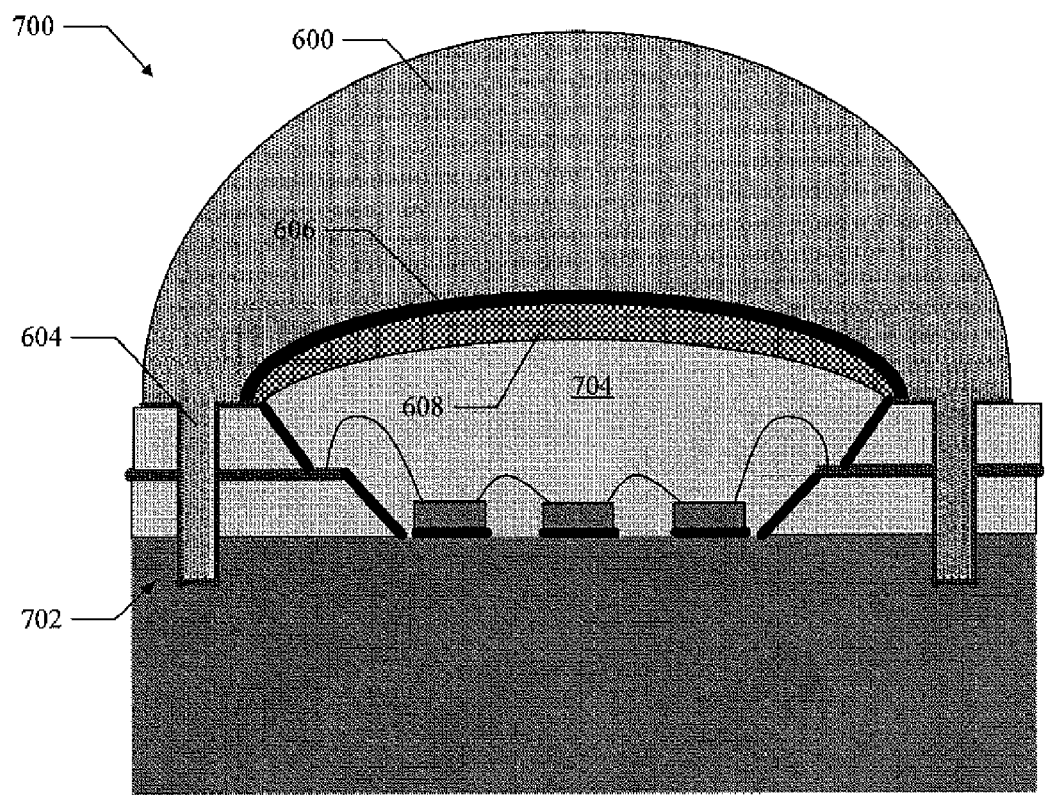
FIG. 7 shows an exemplary LED assembly having aspects of a phosphor layer arrangement.

FIG. 7 shows an exemplary LED assembly 700 having aspects of a phosphor layer arrangement. In the assembly 700, the lens 600 is fitted onto the substrate material 702 by inserting the ridge feature 604 into a slot formed in the substrate material as illustrated at 702. When the lens 700 is fitted on the substrate material 702, the phosphor layer 606 is positioned above the encapsulation 704. In an aspect, an adhesive is used to seal the lens 600 into position.

When the lens 600 is in place, the second lens portion 608 fits against the encapsulation 704 with little or no air gap. The second lens portion 608 provides a low refractive index between the encapsulation 704 and the phosphor layer 606 that reduces backscattering and allows more light to pass through the phosphor layer 606. Thus, the amount of light reflected back into the encapsulation 704 as backscatter is reduced and more light is output from the lens 600.

It should also be noted that in various aspects, the geometries or shapes described with reference to the lens 600 and the phosphor layer 606 may have varying dimensions. Thus, aspects of a phosphor layer arrangement may have varying dimensions and are not limited to having the exact features or dimensions described herein.

Formation of a Phosphor Layer Arrangement

Figure 8:
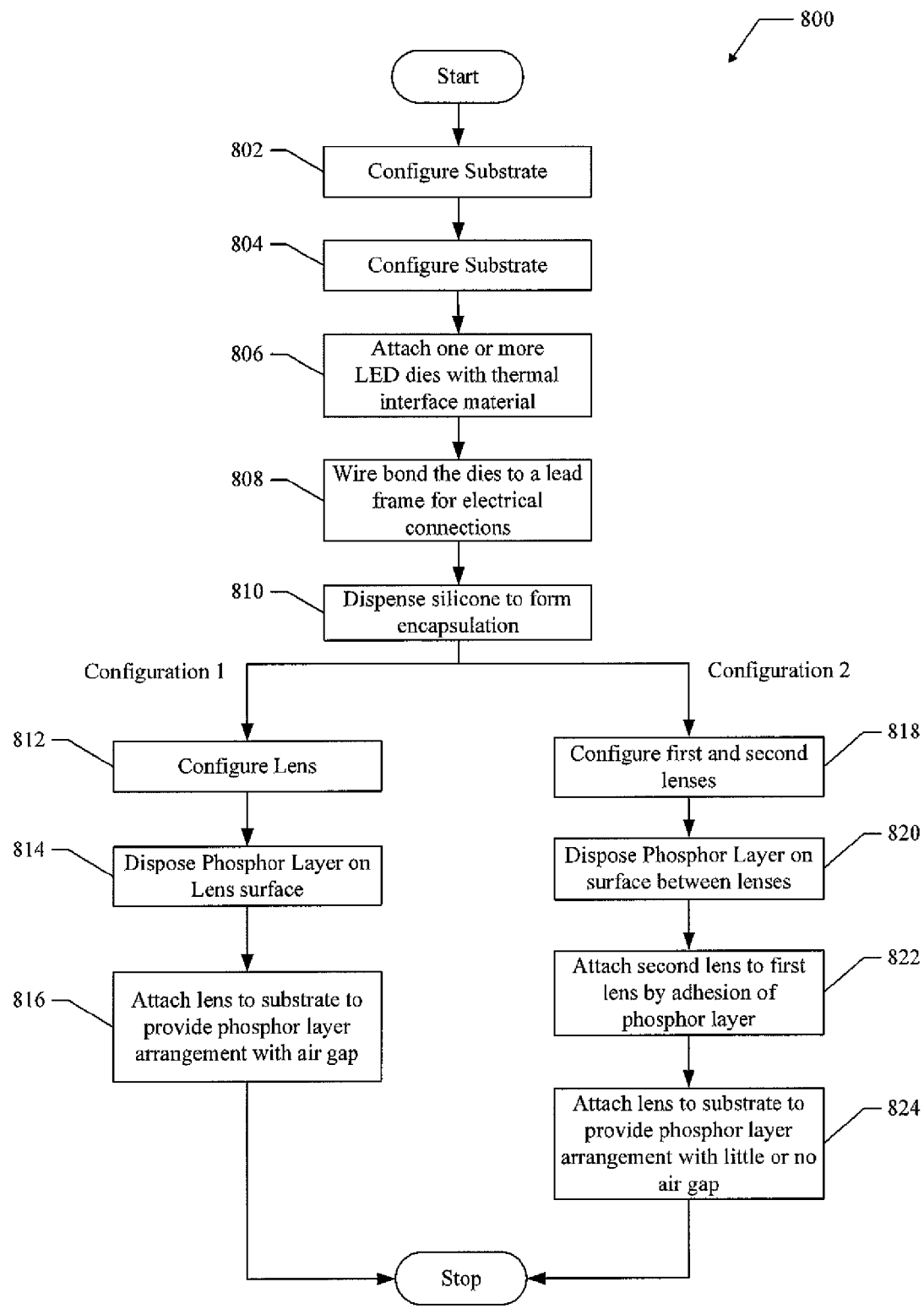
FIG. 8 shows an exemplary method for providing LED assembles having aspects of a phosphor layer arrangement.

FIG. 8 shows an exemplary method 800 for providing LED assembles having aspects of a phosphor layer arrangement. For clarity, the method 800 is described below with reference to the phosphor layer arrangement shown in FIG. 4 and FIG. 7.

At block 802, a substrate is configured. For example, the substrate is configured to carry one or more LED dies and to have a slot, such as slot 116 shown in FIG. 1, for mounting a lens. In an aspect, the substrate is comprised of Al, Cu, AlN, AlSiC or other suitable material.

At block 804, a plastic lamination having a stepped reflector is mounted to the substrate. The plastic (or FR4) lamination includes a lead frame comprising Cu and/or Ag to provide power to the LED dies. The stepped reflector is configured to expose a bonding pad on the lead frame while providing reflecting surfaces to reflect light emitted from the LED dies. For example, the reflecting surfaces comprise Ag plate reflectors.

At block 806, one or more LED dies are attached to the substrate using a thermal interface material. In an aspect, the LED dies emit blue light when power is applied.

At block 808, the LED dies are wire bonded to the lead frame. For example, the LED dies are wire bonded to the bonding pads of the lead frame that are exposed by the stepped reflector of the plastic lamination. The lead frame carries power to the LED dies via the bonded wires.

At block 810, a silicone encapsulation is dispensed within the region formed by the stepped reflector and the substrate to cover the LED dies and bonding wires. The encapsulation operates to extract light and may comprise any suitable shape, such as a domed shape.

At this point, one of two phosphor layer configurations may be formed. A first configuration is formed by blocks 812 through 816. A second configuration is formed by blocks 818 through 824.

First Phosphor Layer Arrangement Configuration

At block 812, a lens is configured. In an aspect, the lens operates to focus light from the LED dies and is configured to have a domed shape. The lens also has a ridge features (i.e., ridge feature 304 as illustrated in FIG. 2, for mounting to the substrate.

At block 814, a phosphor layer is formed upon a lens surface. The phosphor layer converts the blue light emitted from the LED dies to white light. In an aspect, the phosphor layer is an inorganic dye that is molded on a bottom surface of the lens and may be uniform or non-uniform in thickness. In an aspect, the phosphor layer may be configured to have any desired shape and/or thickness.

At block 816, the lens is attached to the substrate to provide a phosphor layer arrangement with an air gap. In an aspect, the lens is fitted over the encapsulation and is mounted to the substrate by inserting the ridge features of the lens into the slots of the substrate. Any type of glue or adhesive may be used to secure the lens to the substrate. In an aspect, the lens is configured so that an air gap is formed between the encapsulation and the phosphor layer. The air gap may be configured to have any desired thickness and/or shape. In an aspect, the air gap provides a low refractive index that reduces backscatter to allow light emitted from the LED dies to pass through the phosphor layer.

Second Phosphor Layer Arrangement Configuration

At block 818, first and second lenses are configured. For example, the first and second lenses are configured to fit together and to mount on the substrate. The first and the second lens are configured to focus light emitted from the LED dies. The first and second lens may have any suitable shape, and when they are fit together they define an internal region with pre-determined dimensions.

At block 820, a phosphor layer is formed upon a lens surface. In an aspect, an inorganic phosphor dye is formed upon the bottom surface of the first lens or on the top surface of the second lens. Thus, the phosphor layer is formed between the first and second lenses. The phosphor layer is configured to have any desired thickness and fit within the internal region defined by the two lens portions.

At block 822, the first and second lenses are attached together to form a lens assembly. In an aspect, the lenses are attached by the adhesion of the phosphor layer.

At block 824, the lens assembly is attached to the substrate to form a phosphor layer arrangement. In an aspect, the lens assembly is mounted to the substrate material using a ridge feature and is sealed onto the substrate material with adhesive. When the lens assembly is mounted onto the substrate material, either no air gap or a small air gap is formed between the encapsulation 202 and the lens assembly. The second lens portion provides a low refractive index that reduces backscatter to allow more light to pass through the phosphor layer.

Therefore, the method 800 operates to provide a LED assembly comprising aspects of a phosphor layer arrangement as described herein. It should be noted that the operations of the method 800 may be rearranged or otherwise modified within the scope of the various aspects. Thus, other implementations are possible with the scope of the various aspects described herein.

Figure 9:
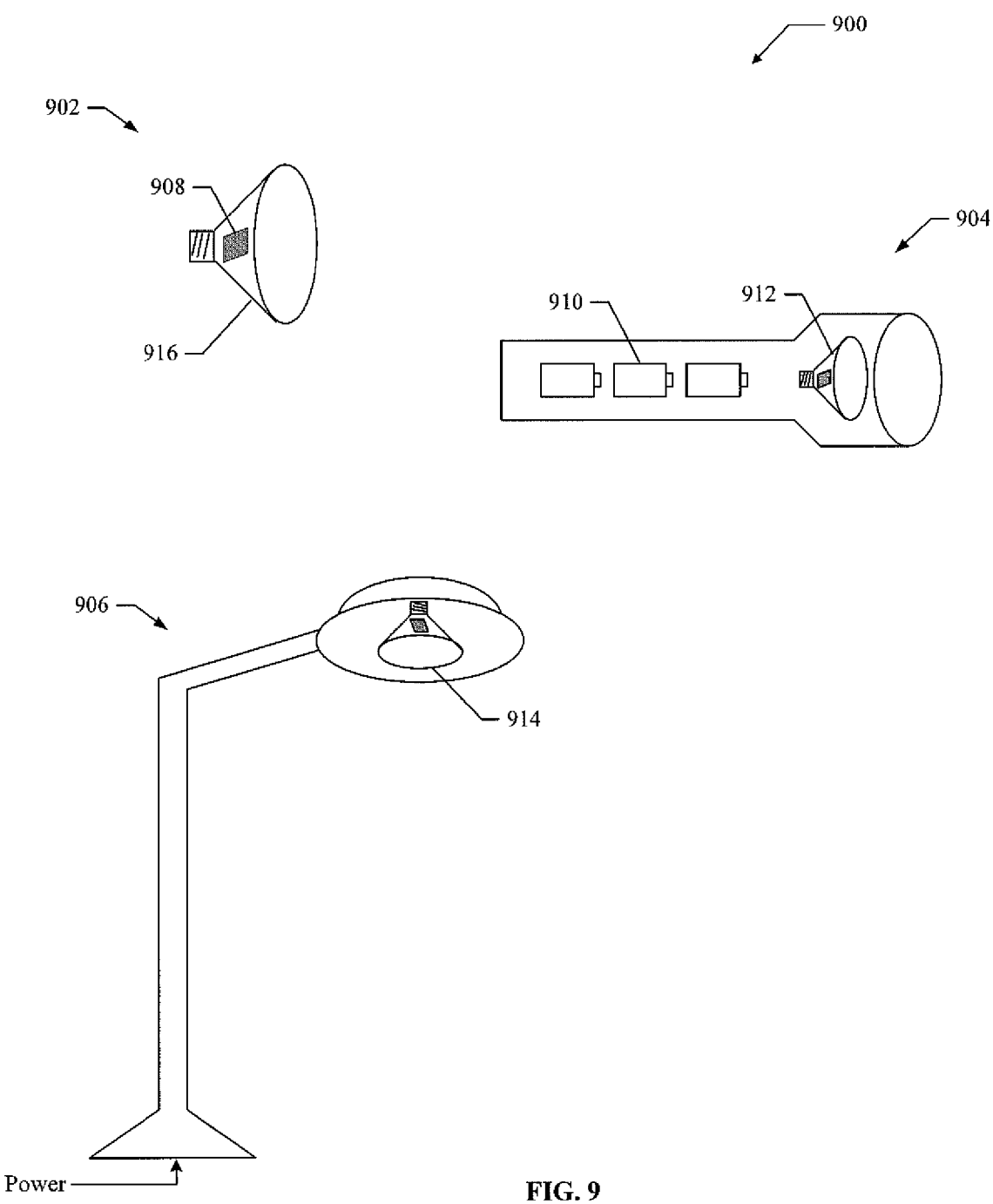
FIG. 9 shows exemplary devices suitable for use with LED assemblies configured to have aspects of a phosphor layer arrangement.

FIG. 9 shows exemplary devices 900 suitable for use with LED assemblies comprising aspects of a phosphor layer arrangement as described herein. FIG. 9 shows a lamp 902, an illumination device 904, and a street light 906. Each of the devices shown in FIG. 9 includes a LED assembly having a phosphor layer arrangement, to provide efficient conversion and extraction of white light. For example, the lamp 902 comprises a package 916 and a LED assembly 908 that includes one or more LEDs and a phosphor layer arrangement to convert and extract light. The lamp 902 may be used for any type of general illumination. For example, the lamp 902 may be used in an automobile headlamp, street light, overhead light, or in any other general illumination application. The illumination device 904 comprises a power source 910 that is electrically coupled to a lamp 912, which may be configured as the lamp 902. In an aspect, the power source 910 may be batteries or any other suitable type of power source, such as a solar cell. The street light 906 comprises a power source connected to a lamp 914, which may be configured as the lamp 902. In an aspect, the lamp 914 comprises a LED assembly that includes one or more LEDs and a phosphor layer arrangement to convert and extract light It should be noted that aspects of the phosphor layer arrangement described herein are suitable for use with virtually any type of LED assembly, which in turn may be used in any type of illumination device and are not limited to the devices shown in FIG. 9. Thus, the phosphor layer arrangement described herein provides for efficient conversion and increased extraction of light emitted from one or more LEDs and can be used in a variety of device applications.

The description of the disclosed aspects is provided to enable any person skilled in the art to make or use the present invention. Various modifications to these aspects may be readily apparent to those skilled in the art, and the generic principles defined herein may be applied to other aspects, without departing from the spirit or scope of the invention. Thus, the present invention is not intended to be limited to the aspects shown herein but is to be accorded the widest scope consistent with the principles and novel features disclosed herein. The word "exemplary" is used exclusively herein to mean "serving as an example, instance, or illustration." Any aspect described herein as "exemplary" is not necessarily to be construed as preferred or advantageous over other aspects.

Accordingly, while aspects of a phosphor layer arrangement have been illustrated and described herein, it will be appreciated that various changes can be made to the aspects without departing from their spirit or essential characteristics. Therefore, the disclosures and descriptions herein are intended to be illustrative, but not limiting, of the scope of the invention, which is set forth in the following claims.

What is claimed is:

1. A method for forming a light emitting diode apparatus, the method comprising:
    encapsulating at least one light emitting diode with an encapsulation;
    forming a stepped reflector as a boundary for the encapsulation wherein the stepped reflector comprises a wire bonding region; and
    covering the encapsulation with a first lens and a second lens having a phosphor layer formed between the first lens and the second lens, the second lens positioned so that the second lens fits against the encapsulation;
    wherein both the first lens and the second lens have a central portion that is thicker than a periphery thereof.

2. The method of claim 1, further comprising forming the phosphor layer with an inorganic dye.

3. The method of claim 1, further comprising forming the phosphor layer to have a uniform thickness.

4. The method of claim 1, further comprising forming the phosphor layer to have a varying thickness.

5. The method of claim 1, further comprising forming the phosphor layer to have a thickness in the range of approximately 5 to 500 microns.

* * * * *